(12) United States Patent
Frisina et al.

(10) Patent No.: US 7,091,558 B2
(45) Date of Patent: Aug. 15, 2006

(54) MOS POWER DEVICE WITH HIGH INTEGRATION DENSITY AND MANUFACTURING PROCESS THEREOF

(75) Inventors: Ferruccio Frisina, Sant'Agata Li Battiati (IT); Giuseppe Ferla, Acicastello (IT); Angelo Magri', Belpasso (IT); Dario Salinas, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 82 days.

(21) Appl. No.: 10/763,818

(22) Filed: Jan. 23, 2004

(65) Prior Publication Data

US 2004/0222483 A1    Nov. 11, 2004

(30) Foreign Application Priority Data

Feb. 21, 2003    (EP)    ................... 03425099

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. .................... 257/341; 257/401
(58) Field of Classification Search ........... 257/341, 257/401
See application file for complete search history.

(56) References Cited

U.S. PATENT DOCUMENTS 5,854,099 A * 12/1998  Farrenkopf ............... 438/201

2001/0050383 A1    12/2001  Hatade et al.
2002/0195654 A1 *  12/2002  Kwon ...................... 257/329

FOREIGN PATENT DOCUMENTS

| EP | 0810671 A2 | 12/1997 |
| EP | 1058316 A1 | 12/2000 |
| JP | 62150770 | 7/1987 |
| JP | 01084671 | 3/1989 |
| WO | WO 99/33119 | 7/1999 |

OTHER PUBLICATIONS

European Search Report, 03425099.3, Aug. 14, 2003.

* cited by examiner

*Primary Examiner*—Phat X. Cao
(74) *Attorney, Agent, or Firm*—Lisa K. Jorgenson; Graybeal Jackson Haley LLP; J. Mark Han

(57) ABSTRACT

A MOS power device having: a body; gate regions on top of the body and delimiting therebetween a window; a body region, extending in the body underneath the window; a source region, extending inside the body region throughout the width of the window; body contact regions, extending through the source region up to the body region; source contact regions, extending inside the source region, at the sides of the body contact regions; a dielectric region on top of the source region; openings traversing the dielectric region on top of the body and source contact regions; and a metal region extending above the dielectric region and through the first and second openings.

15 Claims, 7 Drawing Sheets

MOS POWER DEVICE WITH HIGH INTEGRATION DENSITY AND MANUFACTURING PROCESS THEREOF

PRIORITY CLAIM

This application claims priority from European patent application No. 03425099.3, filed Feb. 21, 2003, which is incorporated herein by reference.

TECHNICAL FIELD

The present invention relates to a MOS power device with high integration density and to the manufacturing process thereof.

BACKGROUND

As is known, MOS power devices have the need to form metal regions with low contact resistances on the front of the chip both on P-type regions (body regions) and on N-type regions (source regions). In fact, two of the fundamental characteristics for good operation of a MOS power transistor are the output resistance (Ron) and the direct voltage drop on the body-drain internal diode (Vf).

For a better understanding of the problems involved, reference may be made to FIG. 1, which illustrates a perspective cross-sectional view of a known MOS power transistor. In detail, the transistor is formed in a body 1 of semiconductor material comprising an N+-type substrate 2 and an N−-type epitaxial layer 3. P-type body regions 4 extend within the epitaxial layer 3 and house N+-type source regions 5. A rear metal region 7 extends on the back of the wafer, in contact with the substrate 2.

Gate regions 10, of polysilicon, extend on top of the body 1 and are electrically insulated from the latter by gate-oxide regions 11. The body regions 4 extend between adjacent gate regions 10, and two source regions 5 housed in two different body regions 4 extend along the edges of each gate region 10. Intermediate-dielectric regions 12 cover the gate regions 10 both at the top and at the sides. A source metal region 13, shown only partially for clarity, covers the surface of the body 1 and, on top of the body regions 4, electrically connects the body region 4 with the source regions 5 housed therein.

The portions of body regions 4 underneath the gate regions 10 (between each source region 5 and the edge of the body region 4 facing it) form channel regions 14.

To have low contact resistances, it is necessary to heavily dope both the N-type surface regions (source regions 5) and the P-type surface regions (body regions 4) in contact with the source metal region 13. The need for heavy doping of these regions gives, however, rise basically to two different problems.

A first problem is linked to the annealing processes subsequent to the implantation process and to their compatibility with the "scaled" thermal processes employed, for instance, in the manufacture of low-voltage submicrometric devices integrated in the same wafer.

The second problem is linked to the need to have low threshold voltages (1–2 V or even less) and hence low concentrations in the channel regions and, at the same time, high doping levels in the surface regions in contact with the metal regions.

In particular, in this regard, carrying out of an additional implantation for enrichment of the surface of the body regions 4 and of the source regions 5, through the windows in the polysilicon layer that forms the gate regions 10, would affect the surface concentration of the channel region 14 after the necessary annealing process. This has adverse effects on the threshold voltage, since both its mean value and the dispersion of its values would increase. In fact, the peak concentration in the channel region 14 is of the order of approximately $10^{17}$ atoms/cm$^3$, while the surface concentrations in the contact area of the source 5 and body 4 regions must be higher than $10^{18}$ atoms/cm$^3$, as may be seen from the plot of the doping profiles along the directions A and B, shown in FIGS. 1a and 1b, respectively.

The implantation dose further affects the defectiveness of the layers. In fact, as the dose increases, the likelihood of having precursor nuclei of extensive defects increases. On the other hand, these cannot be eliminated or in any case reduced to acceptable levels by using intensive thermal treatment, since this treatment could damage other parts or other devices integrated in the same chip.

In the above structure, the source regions 5 are obtained using an appropriate mask aligned inside the windows formed in the polysilicon layer. The above solution maximizes the channel perimeter (i.e., the facing perimeter between the source regions 5 and the channel regions 14) but may be used only when the distance between the gate regions is greater than 1 μm.

However, in case of structures of submicrometric size, the distance between the gate regions tends to be as small as possible, lower than 1 μm. For such devices, it is no longer possible to use the structure of FIG. 1, and the electrical connection between the source and body regions is obtained in two different ways.

For example, FIG. 2 (where L<1 μm) shows a solution wherein short-circuit is obtained through the use of an appropriate source mask. In practice, inside each body region 4, various source regions 5' are formed, that, instead of extending in a continuous way along the edges of the gate regions 10, extend piece-wise in the direction Z for the entire width L (i.e., the width of the implantation windows of the body regions). In this way, body regions 4 have surface portions 4', which face the top surface 6 of the body 1 and are electrically connected with the source regions 5' through the metal layer 13. The above solution leads to a loss of channel perimeter even as much as 30% on account of the perimeter lost at the surface portions 4'. Furthermore, the problem of reducing the concentration of dopants in the source regions 5' and hence of eliminating the problem of defectiveness is not solved.

A second solution, illustrated in FIG. 3, consists in carrying out an etch for partial removal of the source regions in the region facing the surface 6 of the body 1. In practice, in the above solution, the source regions are implanted in the polysilicon over the entire area of the windows. Then, after forming spacers 15 on the sides of the gate regions 10, the portions of the source regions not covered by the spacers 15 are removed for a depth greater that that of the source junction 5. At the end of the process, in each body region 4 just two thin source strips 5" are present underneath the spacers 15, and the surface 6' of the body 1 is no longer planar. In this case, etching of the silicon of the source regions 5 entails the need for contacting the source strips 5" only along their vertical sides, with a considerable reduction in the contact area. Also in the above case, it is not possible to further reduce the defectiveness caused by the heavy doping of the source regions.

In all of the above cases, the source metal region 13 extends along the entire side edge of the gate regions 10 and is insulated from these by the side portions of the intermediate-dielectric regions 12 (see FIG. 1) or by the spacers 15 (see FIGS. 2 and 3). This facing area, hereinafter referred to as "insulation region", is particularly critical and may be the cause of short-circuiting between the gate regions and the source regions on account of poor insulation. The insulation region plays an important role in the percentage of rejects since this percentage is proportional to the perimeter of the region, also referred to as "insulation perimeter". The presence of a high insulation perimeter in known devices is therefore disadvantageous.

The aim of the invention is therefore to provide a MOS power device which will solve the problems outlined above.

SUMMARY

According to aspects of the present invention a MOS power device and the manufacturing process thereof are provided, as defined in claims 1 and 8, respectively.

In this way, the source and body regions are designed just considering the characteristics necessary for the formation of the channel region, which is now independent of the need for having surface concentrations compatible with good contact resistances. In practice, additional degrees of freedom for providing the channel region are obtained.

BRIEF DESCRIPTION OF THE DRAWINGS

For an understanding of the present invention, preferred embodiments thereof are now described, purely by way of non-limiting example, with reference to the annexed drawings, wherein:

FIGS. 1a and 1b illustrate doping profiles corresponding to the device of FIG. 1;

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention.

Thus, the present invention is not intended to be limited to the embodiments shown, but is to be accorded the widest scope consistent with the principles and features disclosed herein.

Figure 4:
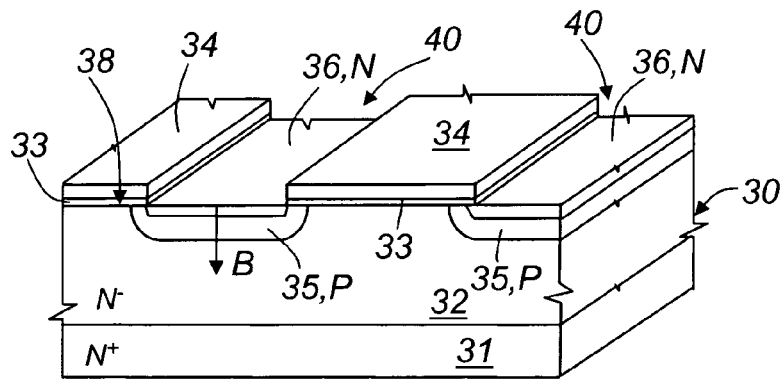
FIG. 4 illustrates a perspective cross-section of a first embodiment of the invention, in a first manufacture step.

Initially (see FIG. 4), a body 30 of semiconductor material is formed comprising an $N^+$-type substrate 31 and an $N^-$-type epitaxial layer 32, which form a drain region of the MOS power transistor to be fabricated. The body 30 has a top surface 38. On top of the body 30 gate oxide regions 33 and gate regions 34, of polysilicon, are formed in a known way. The gate regions 34 are separated from one another by windows 40 using an appropriate photolithographic process.

Figure 4A:
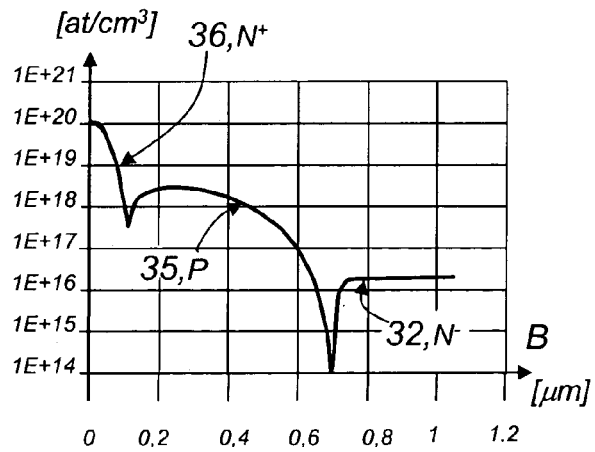
FIG. 4a illustrates a doping profile corresponding to the device of FIG. 4.

Then, body regions 35 and thereafter source regions 36 are implanted in the windows 40. The body implantation is carried out, for instance, with boron, at a dose of $10^{13}$–$10^{14}$ at/cm$^2$ and the source implantation is carried out, for instance, with arsenic, at a dose of 2–5×$10^{14}$ at/cm$^2$. FIG. 4a illustrates the doping levels thus obtained for the source region 36, the body region 35 and the epitaxial layer 32 (underneath the body region 35), along the direction B of FIG. 4.

Then (see FIG. 5), a dielectric layer 41 is deposited (for instance, with a thickness of 500 nm), masked and etched so as to form first openings 42 in the regions where body contact regions are to be obtained. Then a P-type implantation is carried out, for instance, with $BF_2$ at a dose of 1–8×$10^{15}$ at/cm$^2$ and an energy of 40–80 keV.

Figure 5:
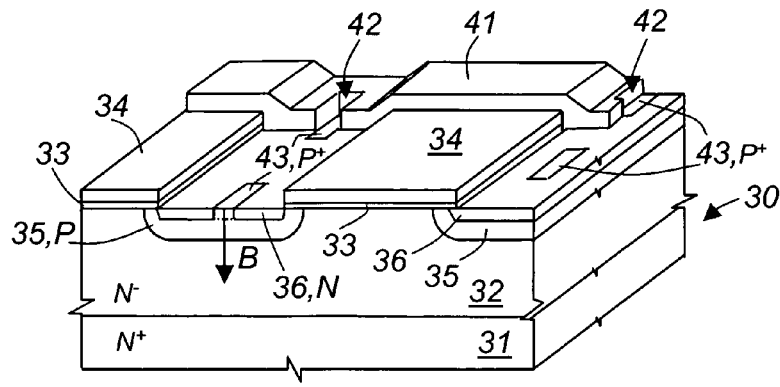
FIG. 5 is a cross-section of the device of FIG. 4, in a subsequent manufacture step.
Figure 5A:
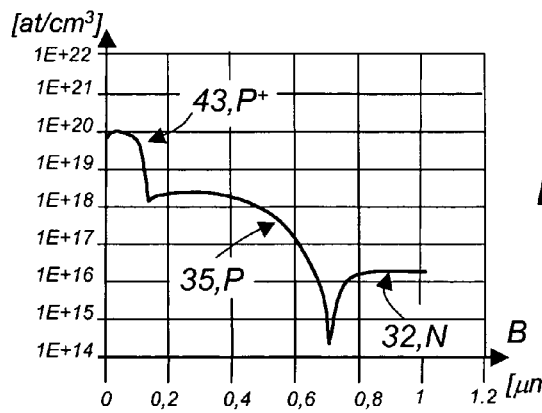
FIG. 5a illustrates a doping profile corresponding to the device of FIG. 5.

In this way, the portions of the source regions 36 underneath the first openings 42 invert their conductivity type, forming P-type body contact regions 43 which extend as far as the body regions 35 (see, in particular, FIG. 5a, which illustrates the doping profile obtained, taken along direction B of FIG. 5). The body contact regions 43 present a higher conductivity than the body regions 35 and in absolute value also higher than the source regions 36 so as to invert them. Thereby, they enable electrical connection between the body regions 35 and the surface 38 of the body 30 and reduce the direct voltage drop Vf of the body-drain internal diode (i.e., the diode formed by the regions 35 and 32).

Figure 6:
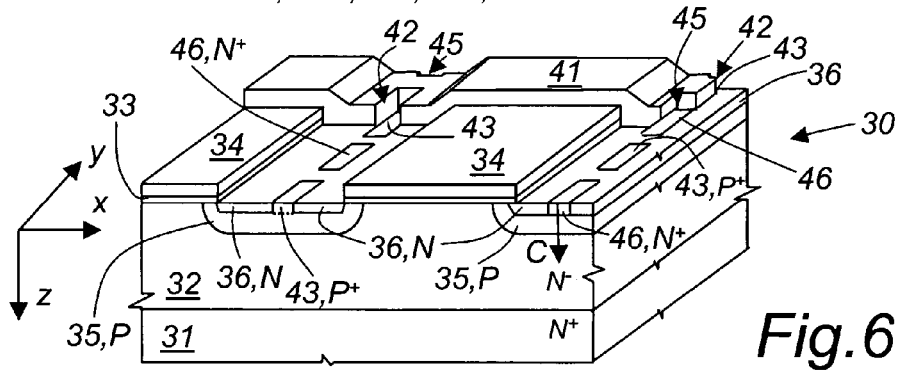
FIG. 6 is a cross-section of the device of FIG. 5, in a subsequent manufacture step.

Next (see FIG. 6), using a mask (not illustrated), the source contacts are opened, and, at the same time and with the same process, the gate and edge contacts of the device are opened (not illustrated in the figure). In particular, in the dielectric layer 41, second openings 45 are made on top of the source regions 36 where the surface is to be enriched. In particular, the second openings 45 are made alternately to the first openings 42, as explained more clearly hereinafter. Next, an N-type implantation is carried out, for example of arsenic or phosphorus at a dose of 1–5×$10^{15}$ at/cm$^2$ and an energy of 40–80 keV. In this step, the body contact regions 43 just obtained are covered by the mask for defining the openings 45 (not illustrated).

Thus $N^+$-type source contact regions 46 are formed, that are alternated to the body contact regions 43 both along a same source region 36 (parallel to the direction Y in FIG. 6) and in a direction perpendicular to the preceding one (parallel to the direction X). The distance between the openings 42 and 45 and hence between the body contact regions 43 and the source contact regions 46 may be chosen as small as possible, for instance of 0.4–1 μm, so as not to jeopardize the strength of the MOS device on account of turning-on of the parasitic transistor formed by the source 36, body 35 and drain (epitaxial layer 32) regions.

Figure 6A:
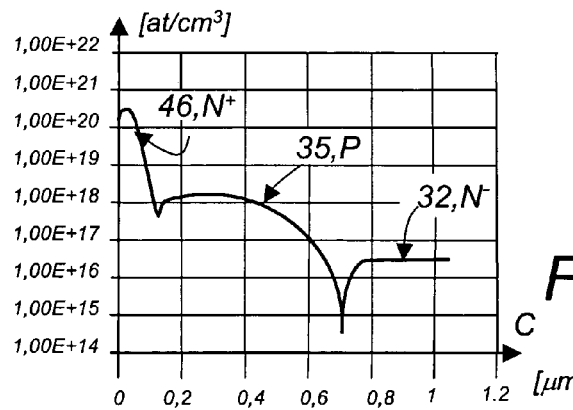
FIG. 6a illustrates a doping profile corresponding to the device of FIG. 6.

After thermal activation of the dopants at a low temperature (800–950° C.), in a cross section taken along the direction C, the doping levels illustrated in FIG. 6a are obtained.

Figure 7:
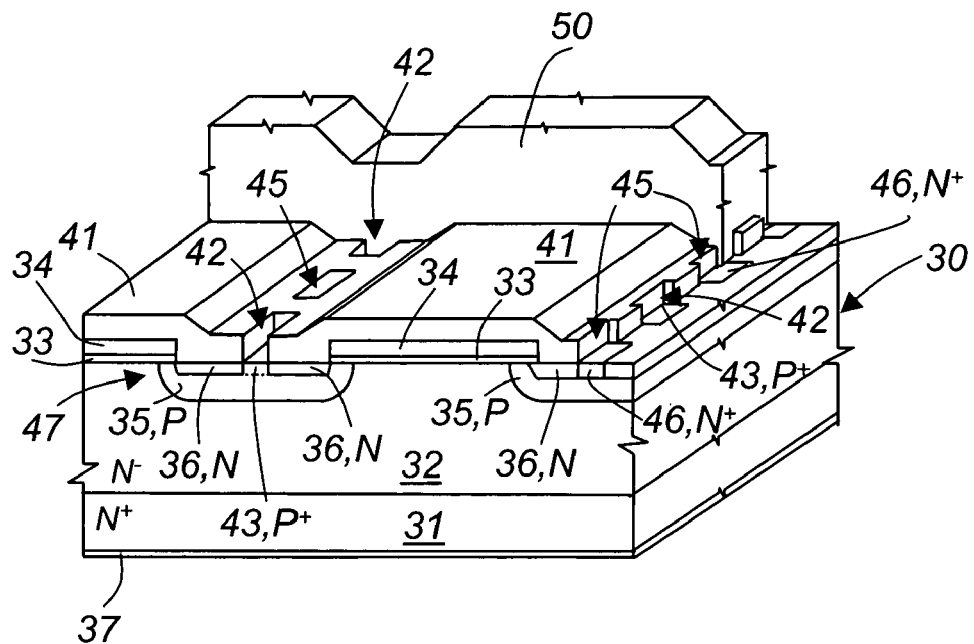
FIG. 7 is a cross-section of the device of FIG. 6, in a final manufacture step.

Finally, on the entire surface of the wafer a source metal region 50 is deposited, which fills the first and second openings 42, 45 and hence alternately contacts the body contact regions 43 and the source contact regions 46. Furthermore, the bottom surface of the body 30 is covered by a rear metal region 37. The final structure of FIG. 7 is thus obtained.

The technique may be extended also to the case of submicrometric devices, for which the size of the opening of the windows 40 between the gate regions 34 does not enable opening of contacts using traditional techniques. In this case, a further mask is provided for separating contact opening on the gate regions from contact opening on the source and body regions, which are obtained by anisotropically etching an insulating layer forming a spacer in a self-aligned manner, as described hereinafter with reference to FIGS. 8–12.

For the above devices, the process comprises (see FIG. 8), after deposition of a polysilicon layer 34, deposition of a first dielectric layer 60 (for instance, of 500 nm), and definition of the first dielectric layer 60 and of the polysilicon layer 34 for forming the gate regions 34 overlaid by the dielectric regions 60. Moreover, the windows 40 are formed through which the body regions 35 and source regions 36 are implanted.

Next (see FIG. 9), a second dielectric layer 61 (for instance, of 500 nm) is deposited, and (see FIG. 10) a first photolithography is performed for forming the second openings 45 on top of the source regions 36. To this end, a first resist mask 62 is formed, and the second dielectric layer 61 is anisotropically etched so as to form spacers 70, on the side of the gate regions 34 exposed by the second openings 45. After removal of the first resist mask 62, a second photolithography is performed (see FIG. 11) for opening contacts on the gate regions. For this purpose, a second resist mask 63 is formed, having third openings 71 in regions of the device where no active areas are present, and a thick field-oxide layer 72 extends underneath the polysilicon layer 34. The second dielectric layer 61 and the first dielectric layer 60 are etched at the third openings 71. Then the second resist mask 63 is removed.

Figure 12:
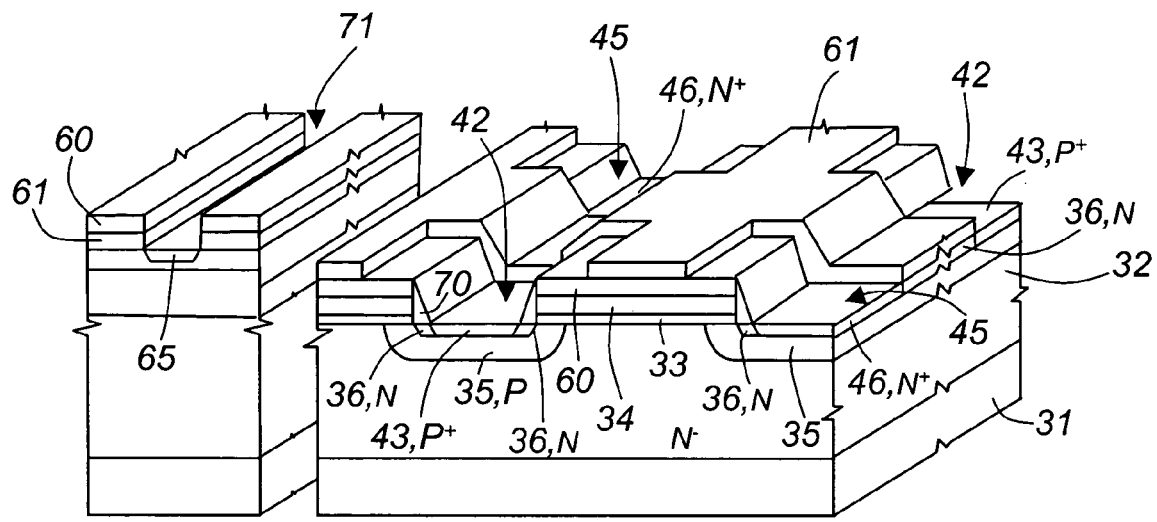

After implantation of the source contact regions 46, through the second openings 45, and of the gate contact regions 65, through the third openings 71 (see FIG. 12), the following steps are carried out: a third photolithography for forming the first openings 42, without subsequently removing the mask; implantation of the body contact regions 43; removal of the mask of the third photolithography; activation of the dopants; and the usual operations for forming metal interconnects and back end. The structure illustrated in FIG. 12 is obtained, where the surface metal layer has not been represented for clarity.

Figure 13:
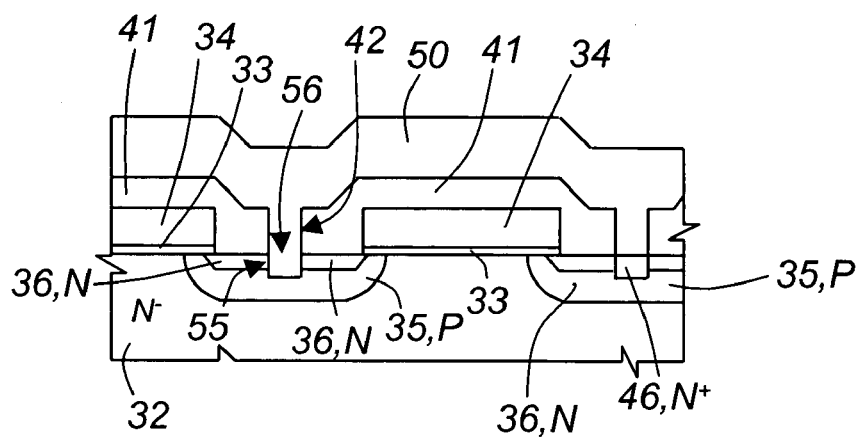
FIG. 13 illustrates a cross-section of a different embodiment of the invention.
Figure 8:
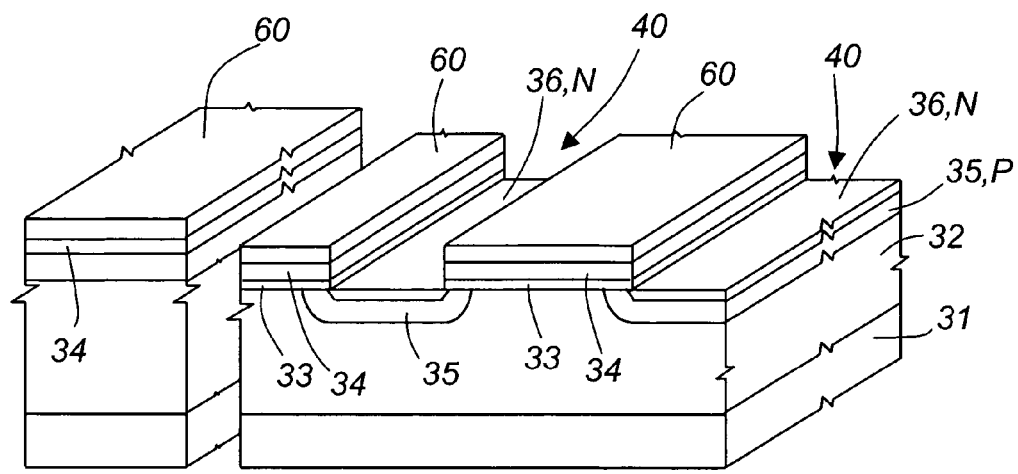
FIGS. 8–12 are perspective cross-sections of a second embodiment of the invention, in successive manufacture steps.
Figure 9:
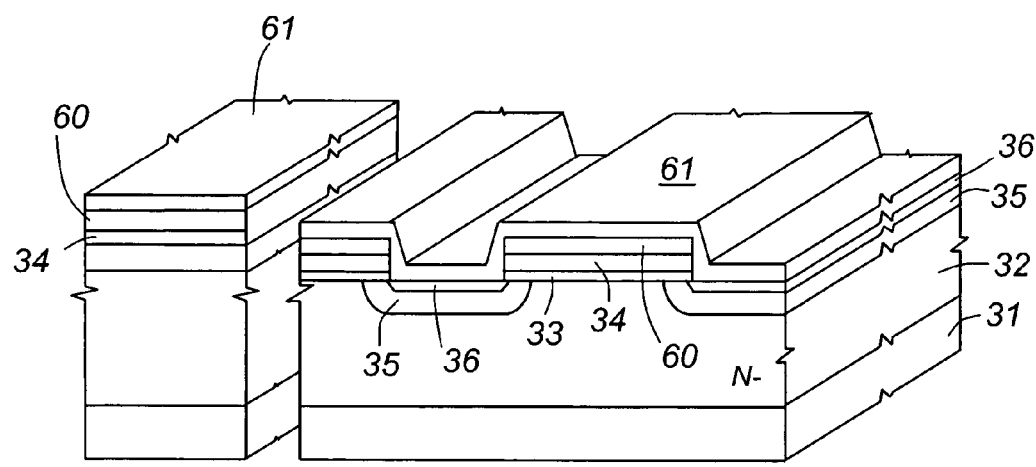
Figure 10:
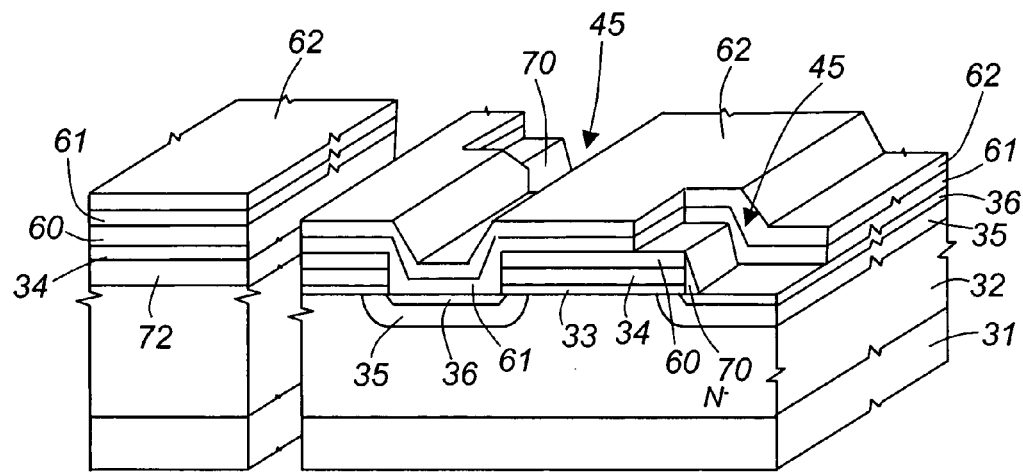
Figure 11:
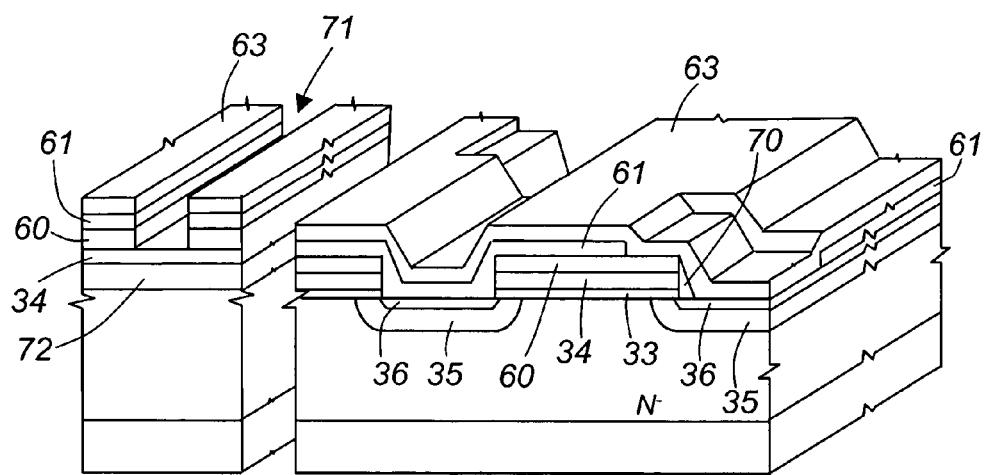

FIG. 13 illustrates a different embodiment wherein the body contact regions, instead of being formed by implanted regions that invert the source regions 36, are made by anisotropically etching the source region 36 which, starting from the surface 38, reaches the body regions 35.

Figure 1:
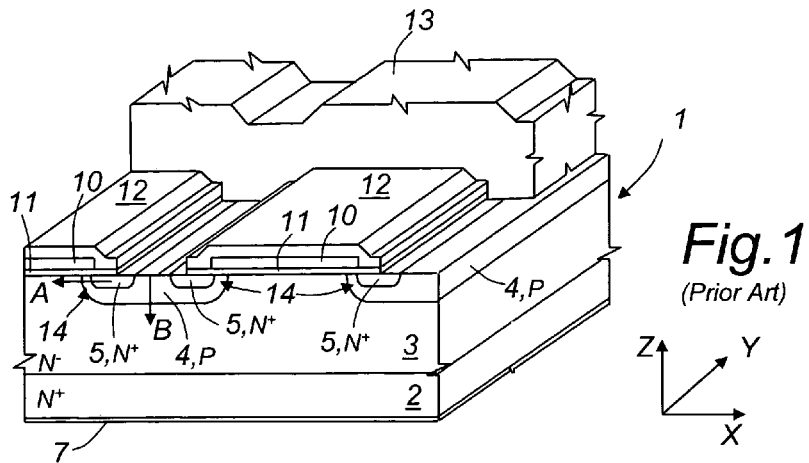
FIG. 1 illustrates a perspective cross-section of a known MOS power device.
Figure 2:
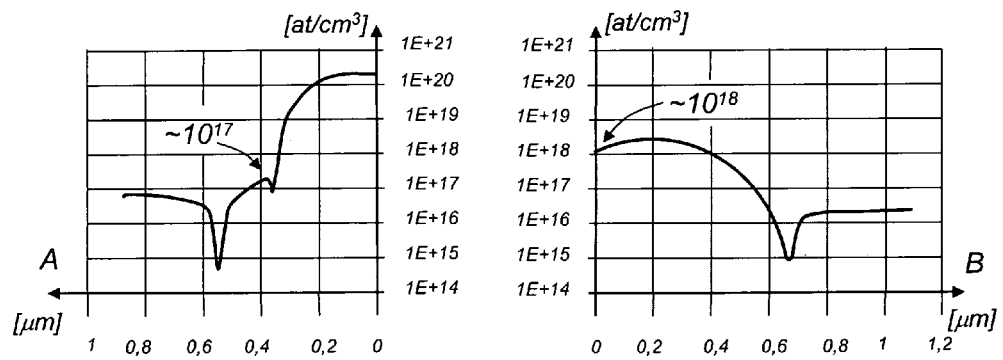
FIG. 2 illustrates a perspective cross-section of another known MOS power device.
Figure 2:
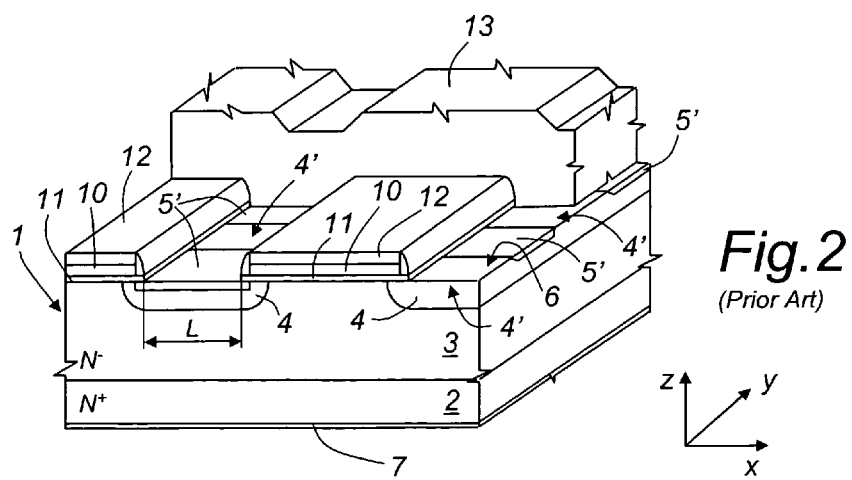
Figure 3:
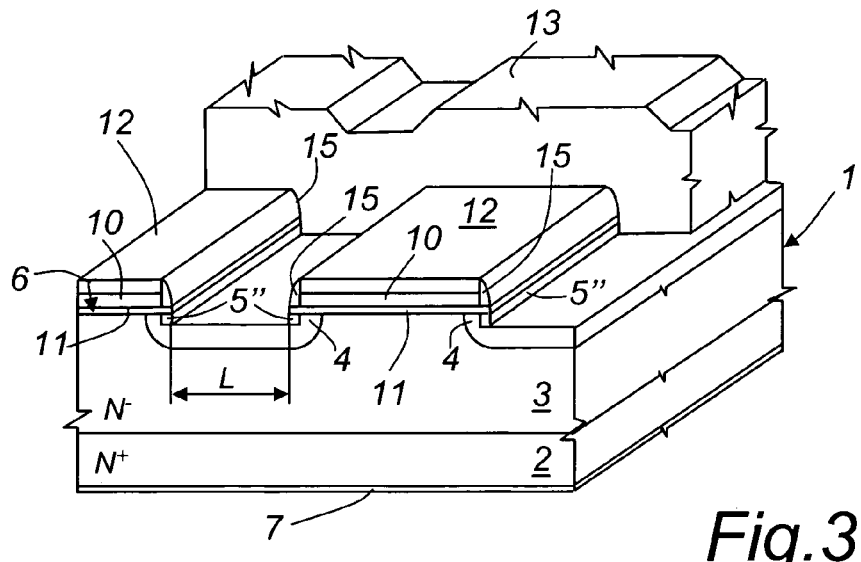
FIG. 3 illustrates a perspective cross-section of a further known MOS power device.

In this way, the source metal layer 50 contacts the body regions 35 in depth, where the concentration of dopant is normally higher (see FIG. 1b). For this purpose, using the known shallow-trench technique and removing part of the source regions 36 underneath the first openings 42, cavities 55 are formed, which reach the body regions 35. In this way, when the source metal region 50 is deposited, this fills the cavity 55 underneath the first openings 42 and, on the bottom of the cavities 55, contacts the body regions 35 with portions 56. In practice, in this solution, the source metal region 50 forms the body contact regions.

The advantages of the device and the process described are outlined hereinafter. First, it is possible to enrich the contact regions (source contact regions 46 for all the embodiments illustrated, body contact regions 43 for the embodiments of FIGS. 7 and 12), without affecting the channel regions 47 of the device. In this way, it is possible to reduce the output resistance and the voltage drop Vf on the body-drain parasitic diode.

The above enrichment may take place without affecting the dose and the implantation conditions of the source 36 and body 35 regions, which may be optimized independently of the other regions. In this way, it is possible to reduce the problem of defects and improve the electrical yield. This is also made possible by the fact that the usual lateral distances between the body and source contact regions 43, 46 and the edge of the gate regions 34 (which is greater than 0.15 µm) and the low thermal budget used for activating the dopants are sufficient to prevent the high dose introduced into the body and source contact regions 43, 46 from affecting the concentration of the dopants in the body region 35 at the channel 47 (see FIG. 7).

A further improvement of the electrical yield and a reduction of the rejects are obtained thanks to the reduction of the insulation perimeter. In fact, the source metal region 50 does not face the side edges of the gate regions in a discontinuous way, and not throughout the length of the source regions 36. In this way, for a same channel perimeter, there is a smaller insulation perimeter.

The reduction in the implantation dose of the source regions 36 enables an improvement of the strength of the device thanks to the reduction of the gain of the source-body-drain transistor.

Finally, it is clear that numerous modifications and variations may be made to the device and the process of manufacture described and illustrated herein, all falling within the scope of the invention, as defined in the annexed claims.

For example, although an N-channel MOS device has been described, the described embodiments of the invention may be applied also to P-channel devices, changing the dopant agents for the various regions (phosphorus or arsenic for body enrichment and $BF_2$ or boron for source enrichment). Opening of the contacts on the polysilicon of the gate regions may be carried out together with that of the source or body regions according to the type of doping.

The succession of steps followed for obtaining the body contact regions 43 and the source contact regions 46 may be inverted with respect to what is described herein.

In addition, as is shown in FIG. 13, the body enrichment may be replaced with a silicon etching.

Finally, although the gate regions 34 have been represented as separate regions, they are generally connected together in such a way as to form a grid with rectangular or square openings in which the body regions 35 and source regions 36 are made, which thus may have a strip-like shape or a square shape. In addition, the embodiments of the invention also apply to other types of layouts; for example, also the body regions 35 may be formed by strips connected together at one end or both ends, as likewise the source regions.

The MOS power devices described in the above embodiments of the present invention may be used in a variety of different types of electronic systems, such as computer, communications, power supply, and control systems.

From the foregoing it will be appreciated that, although specific embodiments of the invention have been described herein for purposes of illustration, various modifications may be made without deviating from the spirit and scope of the invention.

The invention claimed is:

1. A MOS power device, comprising:
a body of semiconductor material having a first conductivity type and a surface;
at least two gate regions, of semiconductor material, arranged on top of said surface of said body and insulated from said body by gate-insulation regions, said gate regions being arranged at a distance from one another and delimiting between them a window having a given width;
a body region housed in said body, underneath said window, said body region having a second conductivity type and a first doping level;
a conductive region, accommodated in said body region and facing said surface, said conductive region having said first conductivity type and a second doping level;
a dielectric region covering said gate regions; and
a metal region extending on top of said dielectric region and being in electrical contact with said body and conductive regions;
characterized by:
first contact regions, distinct from said body region, extending from said surface through said conductive region as far as said body region; and
second contact regions, extending in said conductive region and having said first conductivity type and a third doping level greater than said second doping level, said second contact regions extending at the side of said first contact regions in a direction perpendicular to the width of the window;
wherein said dielectric region further extends on top of said conductive region, at least piece-wise, throughout the width of said window and has first and second openings on top of said first and, respectively, second contact regions,
and wherein said metal region extends through said first and second openings and is in direct electrical contact with said first and second contact regions.

2. The device according to claim 1, wherein said first and second openings are aligned to said first and second contact regions.

3. The device according to claim 1, wherein said window has an area and said conductive region extends throughout the area of said window.

4. The device according to claim 1, wherein said first contact regions have said second conductivity type and a fourth doping level greater than said first doping level.

5. The device according to claim 1, wherein said body has cavities inside said conductive regions underneath said first openings, and said first contact regions are formed by portions of said metal region housed in said cavities.

6. A MOS power device, comprising:
a body of semiconductor material having a first conductivity type and a surface;
at least two gate regions, of semiconductor material, arranged on top of said surface of said body and insulated from said body by gate-insulation regions, said gate regions being arranged at a distance from one another and delimiting between them a window having a given width;
a body region housed in said body, underneath said window, said body region having a second conductivity type and a first doping level;
a conductive region, accommodated in said body region and facing said surface, said conductive region having said first conductivity type and a second doping level;
a dielectric region covering said gate regions; and
a metal region extending on top of said dielectric region and being in electrical contact with said body and conductive regions;
characterized by:
first contact regions, distinct from said body region, extending from said surface through said conductive region as far as said body region; and
second contact regions, extending in said conductive region and having said first conductivity type and a third doping level greater than said second doping level, said second contact regions extending at the side of said first contact regions;
wherein said dielectric region further extends on top of said conductive region, at least piece-wise, throughout the width of said window and has first and second openings on top of said first and, respectively, second contact regions,
wherein said metal region extends through said first and second openings and is in direct electrical contact with said first and second contact regions,
and wherein said body regions and said conductive regions have a strip-like shape, and said first and second contact regions are arranged alternated along said strips.

7. A MOS power device, comprising;
a body of semiconductor material having a first conductivity type and a surface;
at least two gate regions, of semiconductor material, arranged on top of said surface of said body and insulated from said body by gate-insulation regions, said gate regions being arranged at a distance from one another and delimiting between them a window having a given width;
a body region housed in said body, underneath said window, said body region having a second conductivity type and a first doping level;
a conductive region, accommodated in said body region and facing said surface, said conductive region having said first conductivity type and a second doping level;
a dielectric region covering said gate regions; and
a metal region extending on top of said dielectric region and being in electrical contact with said body and conductive regions;
characterized by:
first contact regions, distinct from said body region, extending from said surface through said conductive region as far as said body region; and
second contact regions, extending in said conductive region and having said first conductivity type and a third doping level greater than said second doping level, said second contact regions extending at the side of said first contact regions;
wherein said dielectric region further extends on top of said conductive region, at least piece-wise, throughout the width of said window and has first and second openings on top of said first and, respectively, second contact regions,
wherein said metal region extends through said first and second openings and is in direct electrical contact with said first and second contact regions,
and further comprising at least one further body region, one further conductive region, accommodated in said further body region, and further first and second contact regions, extending in said further conductive region and aligned in a first direction, said first contact regions being aligned with said further second contact regions and said second contact regions being aligned with said further first contact regions in a second direction perpendicular to said first direction.

8. A MOS power device including a body structure forming a drain region of the device, a body region formed in the body structure, a source region formed in the body region, and two gate regions having a distance between each other and formed adjacent and insulated from the body region, the device comprising:
- at least one body contact region formed in the source region and extending through the source region to the body region, each body contact region having a first conductivity type and the body region having the first conductivity type, and each body contact region being more heavily doped than the body region;
- at least one source contact region formed in the source region at a distance from the body contact region in a direction perpendicular to the distance between the gate regions, each source contact region having a second conductivity type and the source region having the second conductivity type, and each source contact region being more heavily doped than the source region; and
- a source conductor region formed on the body and source contact regions.

9. The device of claim 8 wherein the body structure comprises a semiconductor substrate having the second conductivity type and an epitaxial layer formed on a surface of the substrate, the epitaxial layer having the second conductivity type and being more lightly doped than the substrate and the body region being formed in the epitaxial layer.

10. The device of claim 9 wherein the source conductor region comprises a metal layer.

11. The device of claim 10 wherein the body region and source region have a strip-like shape and have a longitudinal axes.

12. The device of claim 11 wherein the source and body contact regions are alternately formed along the longitudinal axes of the body and source regions.

13. The device of claim 12 wherein the first conductivity type comprises a P-type conductivity and the second conductivity type comprises an N-type conductivity.

14. An electronic system including a MOS power device having a body structure forming a drain region of the device, a body region formed in the body structure, a source region formed in the body region, and two gate regions having a distance between each other and formed adjacent and insulated from the body region, the MOS power device including,
- at least one body contact region formed in the source region and extending through the source region to the body region, each body contact region having a first conductivity type and the body region having the first conductivity type, and each body contact region being more heavily doped than the body region;
- at least one source contact region formed in the source region at a distance from the body contact region in a direction perpendicular to the distance between the gate regions, each source contact region having a second conductivity type and the source region having the second conductivity type, and each source contact region being more heavily doped than the source region; and
- a source conductor region formed on the body and source contact regions.

15. The electronic system of claim 14 wherein the system comprises a computer system.

* * * * *